(12) United States Patent
Zhang et al.

(10) Patent No.: US 8,716,151 B2
(45) Date of Patent: May 6, 2014

(54) METHOD OF FABRICATING SEMICONDUCTOR DEVICES

(75) Inventors: Haiyang Zhang, Beijing (CN); Dongjiang Wang, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/326,323

(22) Filed: Dec. 15, 2011

(65) Prior Publication Data

US 2013/0109175 A1    May 2, 2013

(30) Foreign Application Priority Data

Oct. 28, 2011   (CN) .......................... 2011 1 0332325

(51) Int. Cl.
  *H01L 21/31*     (2006.01)
  *H01L 21/469*    (2006.01)
  *H01L 21/3205*   (2006.01)
  *H01L 21/4763*   (2006.01)
  *H01L 21/311*    (2006.01)
  *B44C 1/22*      (2006.01)

(52) U.S. Cl.
  USPC ........... 438/780; 438/586; 438/618; 438/694; 438/781; 438/947; 216/41; 216/49

(58) Field of Classification Search
  USPC ......... 438/221, 586, 694, 700, 780, 781, 947, 438/618; 216/41, 49
  See application file for complete search history.

(56) References Cited

U.S. PATENT DOCUMENTS

| | | | |
|---|---|---|---|
| 6,261,937 B1* | 7/2001 | Tobben et al. | 438/601 |
| 6,358,813 B1* | 3/2002 | Holmes et al. | 438/398 |
| 6,565,763 B1* | 5/2003 | Asakawa et al. | 216/56 |
| 6,630,404 B1* | 10/2003 | Babcock | 438/694 |
| 6,995,439 B1* | 2/2006 | Hill et al. | 257/396 |
| 7,347,953 B2* | 3/2008 | Black et al. | 216/83 |
| 7,384,852 B2* | 6/2008 | Yang et al. | 438/299 |
| 7,767,099 B2* | 8/2010 | Li et al. | 216/2 |
| 2006/0134556 A1* | 6/2006 | Nealey et al. | 430/311 |
| 2006/0249784 A1* | 11/2006 | Black et al. | 257/327 |
| 2007/0257323 A1* | 11/2007 | Tsui et al. | 257/382 |
| 2008/0041818 A1* | 2/2008 | Kihara et al. | 216/41 |
| 2008/0164558 A1* | 7/2008 | Yang et al. | 257/506 |
| 2009/0200646 A1* | 8/2009 | Millward et al. | 257/632 |
| 2010/0210098 A1* | 8/2010 | Faltermeier et al. | 438/586 |

OTHER PUBLICATIONS

Ting, Y-H, et al. "Plasma etch removal of poly(methyl methacrylate) in block copolymer lithography", J. Vac. Sci. Technol. B vol. 26, No. 5, pp. 1684-1689, Sep. 2008.*
Kim Sang-Kon, "Process Simulation of Block Copolymer Lithography," Proceedings of 10$^{th}$ IEEE International Conference on Nanotechnology Joint Symposium with Nano, Korea, Aug. 17-19, 2010, KINTEX, Korea, pp. 335-338.

* cited by examiner

*Primary Examiner* — Mary Wilczewski
*Assistant Examiner* — Erik T Peterson
(74) *Attorney, Agent, or Firm* — Innovation Counsel LLP (57) ABSTRACT

The present disclosure relates to a method of fabricating semiconductor devices. In the method provided by the present invention, by filling with diblock copolymer a recess of an interlayer dielectric layer naturally formed between two gate lines and then performing a self-assembly process of the diblock copolymer, a small-sized contact hole precisely aligned with an doped area can be formed, and thus misalignment between the contact hole and the doped area can be eliminated or alleviated.

25 Claims, 7 Drawing Sheets

METHOD OF FABRICATING SEMICONDUCTOR DEVICES

CROSS-REFERENCES TO RELATED APPLICATIONS

This application claims priority to Chinese Patent Application No. 201110332325.6, filed on Oct. 28, 2011, which is incorporated herein by reference in its entirety.

BACKGROUND OF THE INVENTION

1. Field of the Invention

The present invention relates to a method of fabricating semiconductor devices, particularly to a method of forming a contact hole aligned with a doped area by means of self-assembly process of diblock copolymer.

2. Description of the Related Art

With the development of semiconductor processing techniques, the critical dimension for a semiconductor device has shrunk increasingly. Issues such as how to form a contact hole with smaller size and how to precisely align a contact hole with an active area have been concerned.

In conventional semiconductor device fabrication, a contact hole landing on an active area is formed by performing photolithography and etching by use of photoresist. Specifically, after forming a gate and doped areas of a semiconductor device on a semiconductor substrate, an interlayer dielectric layer is deposited thereon. The interlayer dielectric layer is planarized by chemical mechanical polishing or other processes. A photoresist is spin-coated on the planarized interlayer dielectric layer and then patterned by photolithography including exposure and development operations and the like. Then, the interlayer dielectric layer is etched by using the patterned photoresist as a mask, until the doped areas are exposed, so as to form the contact holes for those doped areas.

However, with the continuous shrink of the critical dimension of semiconductor devices, the above conventional photolithography has reached its limitation on misalignment control. Misalignment control is especially critical for a contact hole landing on an active area. Position offset between a contact hole formed by the above method and an active area usually occurs, therefore, it is difficult to achieve precise alignment.

Figure 1A:
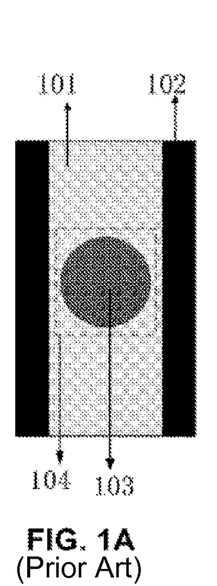
FIGS. 1A~1C are exemplary top views respectively showing different kinds of relative position relationships between a contact hole and a doped area.
Figure 1B:
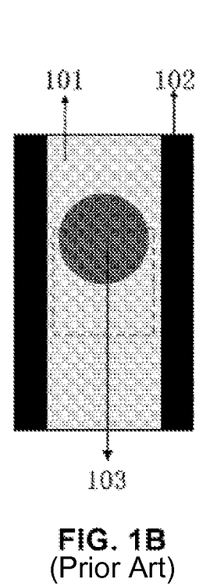
Figure 1C:
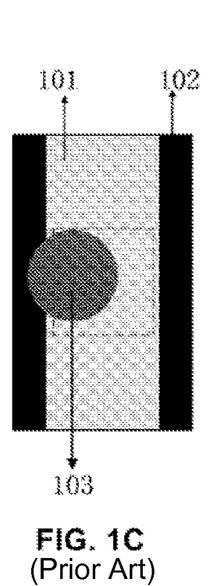
Figure 1D:
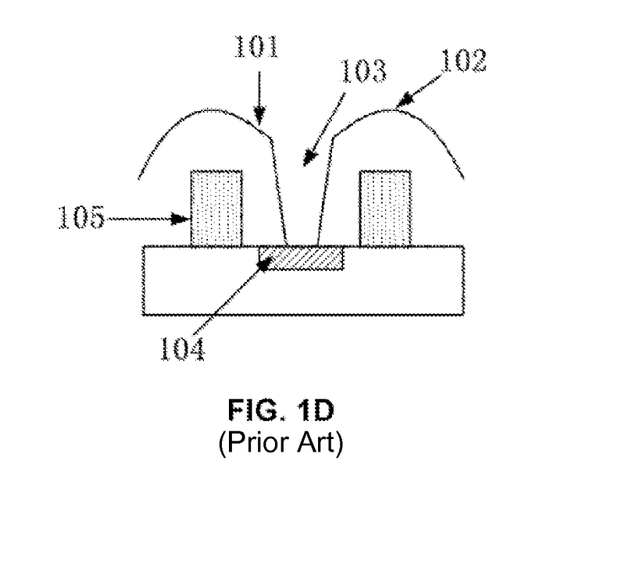
FIG. 1D is an exemplary sectional view of the semiconductor device corresponding to FIG. 1A.

FIGS. 1A~1C are exemplary top views respectively showing different kinds of relative position relationships between a contact hole and a doped area. FIG. 1D is an exemplary sectional view of the semiconductor devices corresponding to FIG. 1A.

FIG. 1A shows the relative position between a contact hole 103 and a doped area 104 in a desired alignment situation, in which the contact hole is located at the centre of the doped area. Referring to its corresponding sectional view, FIG. 1D, reference number 101 represents a recess of an interlayer dielectric layer between two gate lines 105, and reference number 102 represents peaks of the interlayer dielectric layer above those two gate lines 105.

FIG. 1B shows a situation in which the contact hole 103 is shifted with respect to the doped area 104 along a direction parallel to the gate lines 105. In this situation, although there is a shift between the contact hole 103 and the doped area 104, such shift is acceptable because the contact hole 103 still partially contacts the doped area 104 and does not contact any other members.

FIG. 1C shows a situation in which the contact hole 103 is shifted with respect to the doped area 104 along a direction vertical to the gate lines 105. As shown in FIG. 1C, such shift of contact hole 103 may cause to remove a portion of the interlayer dielectric layer above the gate line 105, so as to expose the gate line 105. That is to say, the contact hole 103 would land on both of the gate line 105 and the doped area 104, resulting in the gate line 105 being connected with the doped area 104. Thus, such shift is absolutely unacceptable. Thus, it is desired to avoid the occurrence of such misalignment.

In view of the above problem, it is desired to provide a method of fabricating semiconductor devices which can prevent the occurrence of the above-described misalignment between a contact hole and a doped area, thereby improving the yield of semiconductor devices.

BRIEF SUMMARY OF THE INVENTION

An object of the present invention is to alleviate or eliminate the above-described misalignment between a contact hole and a doped area while obtaining the contact hole with small size.

According to a first aspect of the present invention, there is provided a method of fabricating semiconductor devices, comprising: forming at least two adjacent gate lines on a substrate, and forming a doped area in the substrate between the two adjacent gate lines; depositing an interlayer dielectric layer overlying the gate lines on the substrate, the interlayer dielectric layer having a recess between the two adjacent gate lines; depositing a hard mask layer on the interlayer dielectric layer; etching the hard mask layer, so as to form an opening in the hard mask layer, from which at least a portion of the recess above the doped area is exposed; forming a diblock copolymer over the exposed portion of the recess above the doped area, the diblock copolymer being composed of a first component and a second component; performing a self-assembly process on the diblock copolymer, so as to form a circular pattern of the first component above the doped area, the circular pattern of the first component being surrounded by the second component; removing the first component; and etching the interlayer dielectric layer by using the second component and the hard mask layer as masks, until the doped area is exposed, so as to form a contact hole for contacting the doped area.

Preferably, the above method further comprises: after forming the contact hole, filling the contact hole with metal. More preferably, the metal comprises copper (Cu).

Preferably, the above method further comprises: after filling the contact hole, performing a planarization process so as to planarize the surfaces of the interlayer dielectric layer and the filled metal. More preferably, the planarization process is performed by chemical mechanical polishing. More preferably, the above method further comprises: after performing the planarization process, depositing another interlayer dielectric layer, and patterning said another interlayer dielectric layer through photolithography and etching, so as to form contact holes for contacting the gate lines and a contact hole for forming a share contact member. More preferably, the above method further comprises: after forming the contact holes for contacting the gate lines and the contact hole for forming the share contact member, filling these contact holes with metal, and then performing a planarization process so as to planarize the surfaces of said another interlayer dielectric layer and the filled metal. More preferably, the contact holes for contacting the gate lines and the contact hole for forming the share contact member are filled with copper. More preferably, the planarization process is performed by chemical mechanical polishing.

Preferably, the hard mask layer is etched by a dry etching process.

Preferably, the hard mask layer comprises silicon nitride, titanium nitride, or boron nitride.

Preferably, the step of forming the diblock copolymer is performed by a spin coating process.

Preferably, the diblock copolymer is polystyrene-block-poly(methyl methacrylate) copolymer, in which the first component is poly(methyl methacrylate) and the second component is polystyrene.

Preferably, the self-assembly process is a solvent fumigation or an annealing process.

Preferably, the first component is removed by a plasma etching process. More preferably, the gases used in the plasma etching process comprise: $O_2$, $Ar/O_2$, $Ar$, $CF_4$ or $CHF_3/O_2$.

Preferably, the first component is removed by a wet etching process. More preferably, the first component is wet etched away by using acetic acid.

Preferably, the diameter of the circular pattern of the first component is controlled by adjusting the mass ratio of the first and second components in the diblock copolymer or the molecular weight of the diblock copolymer.

Preferably, the interlayer dielectric layer is etched by a plasma etching process.

Preferably, the opening is a trench-shaped opening, the length direction of which is perpendicular to the length direction of the gate lines. More preferably, the step of forming the diblock copolymer comprises: forming a film of the diblock copolymer by a spin coating process; and uniformly etching the film of the diblock copolymer such that only the portion of the recess exposed from the opening is filled with the diblock copolymer. Still more preferably, the above method further comprises: before removing the first component, coating a photoresist, and then patterning the photoresist so as to at least cover a portion of the interlayer dielectric layer that is not covered by the hard mask layer and the diblock copolymer.

Preferably, the opening in the hard mask layer is a rectangular opening, which does not extend beyond the recess of the interlayer dielectric layer in the direction perpendicular to the length direction of the gate lines. More preferably, the step of forming the diblock copolymer comprises: forming a film of the diblock copolymer by a spin coating process; and uniformly etching the film of the diblock copolymer such that only the opening in the hard mask layer is filled with the diblock copolymer.

An advantage of the present invention lies in that, by means of the self-assembly characteristic of a diblock copolymer and a recess of an interlayer dielectric layer naturally formed between two gate lines, it is ensured that a contact hole for a doped area can be precisely aligned with the doped area, thereby improving the yield of semiconductor devices. Furthermore, according to the method of the present invention, a contact hole with small size can be obtained.

Another advantage of the present invention lies in that, the process of forming a contact hole by means of diblock copolymer is simple and compatible with standard processes of semiconductor device fabrication, thereby reducing cost for fabricating semiconductor devices.

Further features of the present invention and advantages thereof will become apparent from the following detailed description of exemplary embodiments according to the present invention with reference to the accompanying drawings.

BRIEF DESCRIPTION OF THE DRAWINGS

With reference to the accompanying drawings, the present invention can be more clearly understood based on the following detailed description. For the purpose of clarity, the relative thicknesses of various layers and the relative sizes of specific regions in those drawings are not drawn to scale. In these drawings.

DETAILED DESCRIPTION OF THE INVENTION

A diblock copolymer contains two chemically distinct polymer blocks. After performing a certain process (for example, solvent fumigation, annealing process or the like) on the diblock copolymer, those two kinds of blocks are segregated and spontaneously self-assemble into nanoscale domains that exhibit ordered morphology.

In the prior art, a method of forming a trench by a self-assembly process of diblock copolymer has been proposed by Sang-Kon Kim (see "Process Simulation of Block Copolymer Lithography", Proceedings of $10^{th}$ IEEE International Conference on Nanotechnology Joint Symposium with Nano, Korea, 2010). In this method, the self-assembly is directed by graphoepitaxy or by using a surface chemical pattern. By means of annealing process, polystyrene (PS) component and poly(methyl methacrylate) (PMMA) component in polystyrene-block-poly(methyl methacrylate) (PS-b-PMMA) copolymer are separated, and thus alternating linear domains of PS and PMMA are formed on the substrate. Then, the linear domains of PMMA are selectively removed with acetic acid under the irradiation of ultraviolet light, thereby forming trenches on the substrate.

It has been found by the inventors of the present invention that, in the case of confining diblock copolymer in a rectangular frame, after performing a self-assembly process of the diblock copolymer, one component of the diblock copolymer may form a cylindrical structure at the centre of the rectangular frame. The diameter of the cylindrical structure can be controlled by adjusting the mass ratio of two components in the diblock copolymer or the molecular weight of the diblock copolymer, and the diameter of the cylindrical structure may be as small as about 10 nm. Thus, it is possible to take advantage of such self-assembly characteristic of diblock copolymer to form a contact hole with small size on a doped area, and to ensure that the contact hole for the doped area can be precisely aligned with the doped area.

The present invention has been proposed based on the above principle.

Various exemplary embodiments of the present invention will be described in detail below with reference to the drawings. It should be noted that the relative arrangement of the components and steps, the numerical expressions, and numerical values set forth in these embodiments do not limit the scope of the present invention unless it is specifically stated otherwise. Further, similar reference numerals and letters refer to similar items in the following figures, and thus once an item is defined in one figure, it is possible that it need not be further discussed in subsequent figures.

The following description of at least one exemplary embodiment is merely illustrative in nature and is in no way intended to limit the invention, its application, or uses. Technologies well known in the art can be applied to parts that are not specifically illustrated or described. In all of the examples illustrated and discussed herein, any specific values should be interpreted to be illustrative only and non-limiting. Thus, other examples of the exemplary embodiments could have different values.

Figure 2:
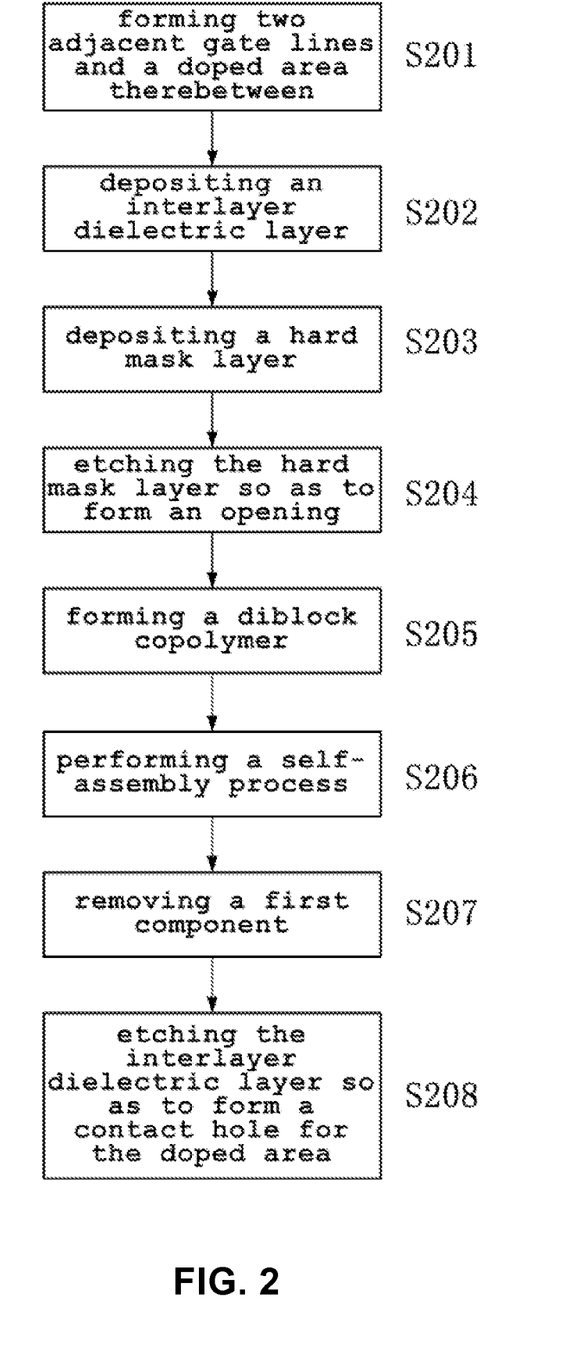
FIG. 2 briefly shows a flowchart of a method of fabricating semiconductor devices according to one embodiment of the present invention.

FIG. 2 briefly shows a flowchart of a method of fabricating semiconductor devices according to one embodiment of the present invention.

As shown in FIG. 2, the method of fabricating semiconductor devices according to one embodiment of the present invention comprises the steps of:

forming at least two adjacent gate lines on a substrate, and forming a doped area in the substrate between the two adjacent gate lines (S201);

depositing an interlayer dielectric layer overlying the gate lines on the substrate, the interlayer dielectric layer having a recess between the two adjacent gate lines (S202);

depositing a hard mask layer on the interlayer dielectric layer (S203);

etching the hard mask layer, so as to form an opening in the hard mask layer, from which at least a portion of the recess above the doped area is exposed (S204);

forming a diblock copolymer over the exposed portion of the recess above the doped area, the diblock polymer being composed of a first component and a second component (S205);

performing a self-assembly process on the diblock copolymer, so as to form a circular pattern of the first component above the doped area, the first component being surrounded by the second component (S206);

removing the first component (S207); and etching the interlayer dielectric layer by using the second component and the hard mask layer as masks, until the doped area is exposed, so as to form a contact hole for contacting the doped area (208).

Hereinafter, the method of fabricating semiconductor devices according to the embodiment shown in FIG. 2 will be described in detail, taking two kinds of patterns of the opening formed in the hard mask layer as examples. Those skilled in the art will appreciate that opening patterns formed in the hard mask layer are not limited to those two kinds of patterns described below, so long as it is possible to define the desired shape and position of diblock copolymer by the opening pattern, so as to form a circular contact hole at a desired position.

EXAMPLE 1

FIGS. 3A~3F are exemplary sectional views of semiconductor devices in one example of the method of fabricating semiconductor devices as shown in FIG. 2, and FIGS. 3G~3L are top views respectively corresponding to FIGS. 3A~3F. Moreover, FIGS. 3A~3F are sectional views taken along the line A-A.

Figure 3A:
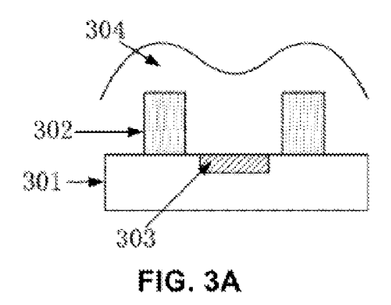
FIGS. 3A~3F are exemplary sectional views of semiconductor devices in one example of the method of fabricating semiconductor devices as shown in FIG. 2, and FIGS. 3G~3L are top views respectively corresponding to FIGS. 3A~3F.
Figure 3B:
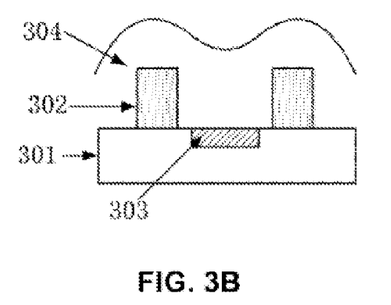
Figure 3C:
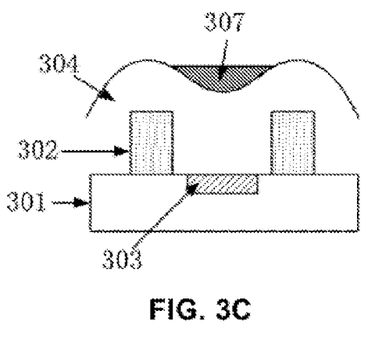
Figure 3D:
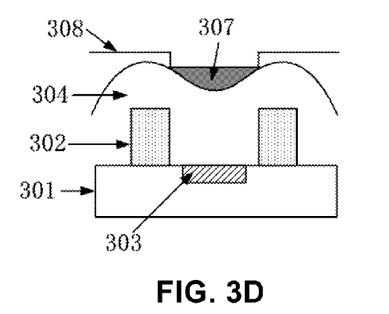
Figure 3E:
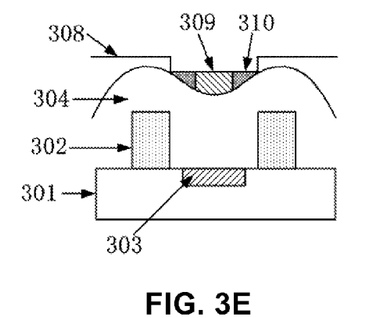
Figure 3F:
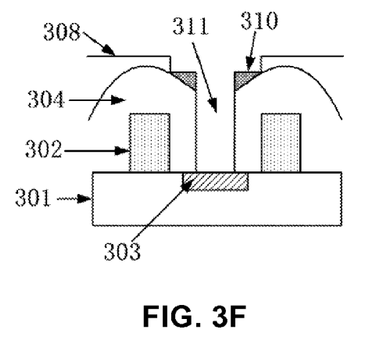
Figure 3G:
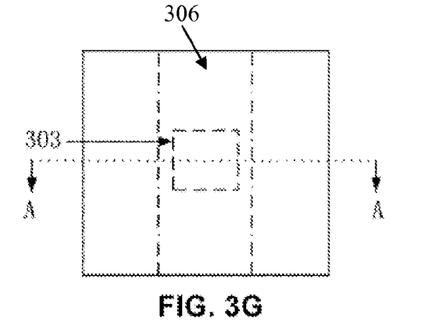

First, referring to FIG. 3A and the corresponding FIG. 3G, at least two adjacent gate lines 302 are formed on a substrate 301, and an doped area 303 is formed in the substrate between the two gate lines 302 (S201). Then, an interlayer dielectric layer 304 is deposited overlying the gate lines 302 on the substrate 301 (S202). The surface of the substrate is not flat due to the present of the two gate lines 302, therefore the deposited interlayer dielectric layer 304 naturally has a recess 306 between the two gate lines 302. For convenience, in FIG. 3G, the recess 306 is denoted by a dash dotted line (two dashes-one dot), and the doped area 303 in the substrate is denoted by a dashed line.

Figure 3H:
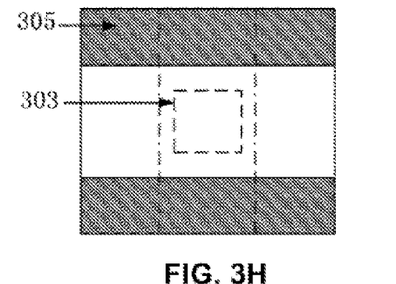

Next, referring to FIG. 3B and the corresponding FIG. 3H, a hard mask layer 305 is deposited on the interlayer dielectric layer 304 (S203). Then, the hard mask layer 305 is etched so as to form an opening in the hard mask layer 305, from which at least a portion of the recess 306 above the doped area 303 is exposed (S204). For example, the hard mask layer 305 may be etched by a dry etching process. The hard mask layer 305 may comprise, for example, silicon nitride, titanium nitride, boron nitride or the like.

In the present example, as shown in FIG. 3H, the opening is a trench-shaped opening, the length direction of which is perpendicular to the length direction of the gate lines 302. Since FIG. 3B is the sectional view taken along the line A-A in the trench-shaped opening, the hard mask layer 305 is not shown in the sectional view of FIG. 3B.

Figure 3I:
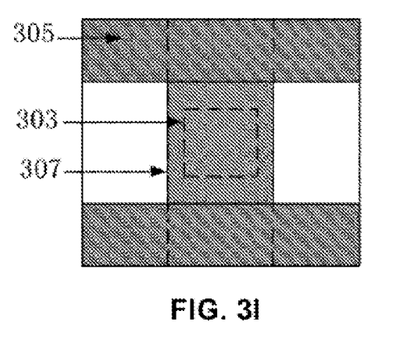

Next, referring to FIG. 3C and the corresponding FIG. 3I, a diblock copolymer 307 composed of a first component and a second component is formed over the exposed portion of the recess 306 above the doped area 303 (S205). For example, the step of forming the diblock copolymer 307 may be performed by a spin coating process. For example, the diblock copolymer 307 may be polystyrene-block-poly(methyl methacrylate) (PS-b-PMMA) copolymer, in which the first component is poly(methyl methacrylate) (PMMA) and the second component is polystyrene (PS). The diblock copolymer 307 over the exposed portion of the recess above the doped area 303 may have a substantially rectangular shape.

In the present example, the step of forming the diblock copolymer 307 may comprise: forming a film of the diblock copolymer by a spin coating process; and uniformly etching the film of the diblock copolymer such that only the portion of the recess 306 exposed from the opening is filled with the diblock copolymer, as shown in FIG. 3I.

Figure 3J:
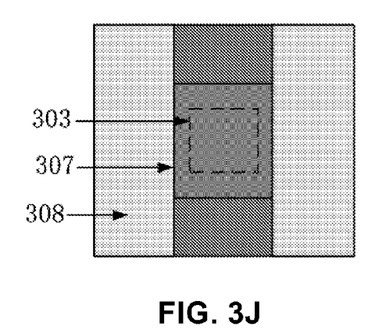

Optionally, after the step of forming the diblock copolymer, a photoresist 308 may be coated and patterned so as to at least cover a portion of the interlayer dielectric layer 304 that is not covered by the hard mask layer 305 and the diblock copolymer 307, as shown in FIG. 3D and the corresponding FIG. 3J. The photoresist 308 is used to protect the portion of the interlayer dielectric layer 304 that is exposed and is not expected to be etched away during forming a contact hole for the doped area later. In the present example, it is not necessary to perform the above operations for the photoresist at this stage, so long as the above-described coating and patterning operations for the photoresist are performed before removing the first component.

Figure 3K:
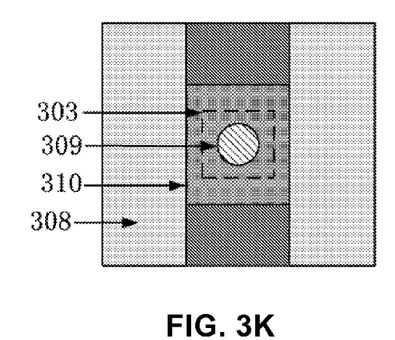

Next, referring to FIG. 3E and the corresponding FIG. 3K, a self-assembly process of the diblock copolymer 307 is performed (S206), so as to form a circular pattern of the first component 309 above the doped area 303, and the first component 309 is surrounded by the second component 310. For example, the self-assembly process may be solvent fumigation or annealing process. The shape and position of the pattern of the first component 309 formed by the self-assembly process are influenced by the boundary conditions. In the present example, as shown in FIG. 3K, since the diblock copolymer 307 is confined in an enclosed rectangular frame, the pattern of the first component 309 is a circle located at the centre of the rectangular frame, and the second component 310 surrounds the circular pattern of the first component 309. The diameter of the circular pattern of the first component 309 is controlled by adjusting the mass ratio of the first and second components in the diblock copolymer 307 or the molecular weight of the diblock copolymer 307. Specifically, in the case of employing PS-b-PMMA as the diblock copolymer, by adjusting the mass ratio of the PS and PMMA components or the molecular weight of PS-b-PMMA based on the desired diameter of the contact hole to be formed, the circular pattern of the PMMA component can be formed to have a diameter substantially equal to the desired diameter of the contact hole.

By controlling the mass ratio of the first and second components or the molecular weight of the diblock copolymer, the circular pattern of the first component can be formed to have very small diameter which is required with the scale-down of semiconductor devices.

Figure 3L:
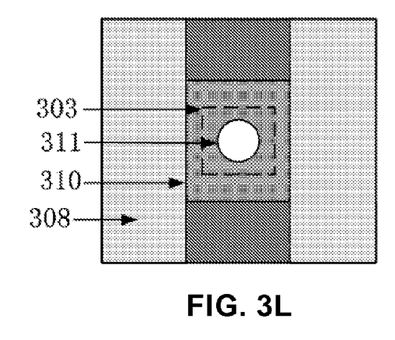

Next, referring to FIG. 3F and the corresponding FIG. 3L, the first component 309 is removed (S207). Then the interlayer dielectric layer 304 is etched by using the second component 310 and the hard mask layer 305 as masks, until the doped area 303 is exposed, thereby forming a contact hole 311 for the doped area (S208). In the present example, the photoresist 308 shown in FIG. 3D and FIG. 3J is also used as the mask for etching the interlayer dielectric layer 304.

For example, the first component 309 may be removed by a plasma etching process. The gases used in the plasma etching process may comprise, for example: $O_2$, $Ar/O_2$, $Ar$, $CF_4$ or $CHF_3/O_2$. Alternatively, the first component 309 may be removed by a wet etching process. For example, the first component 309 may be wet etched away by using acetic acid. In the case that PMMA is used as the first component, the PMMA component may be selectively removed with acetic acid under the irradiation of ultraviolet light. For example, the interlayer dielectric layer 304 may be etched by a plasma etching process.

Finally, a contact hole with small size that is precisely aligned with the doped area 303 is formed.

EXAMPLE 2

FIGS. 4A~4E are exemplary sectional views of semiconductor devices in another example of the method of fabricating semiconductor devices as shown in FIG. 2, and FIGS. 4F~4J are top views respectively corresponding to FIGS. 4A~4E. Moreover, FIGS. 4A~4E are sectional views taken along the line A-A.

Figure 4A:
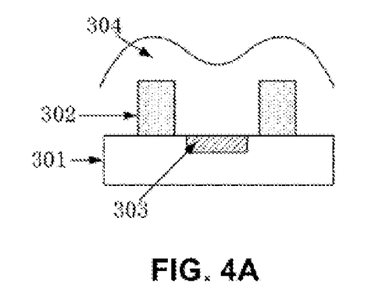
FIGS. 4A~4E are exemplary sectional views of semiconductor devices in another example of the method of fabricating semiconductor devices as shown in FIG. 2, and FIGS. 4F~4J are top views respectively corresponding to FIGS. 4A~4E.
Figure 4B:
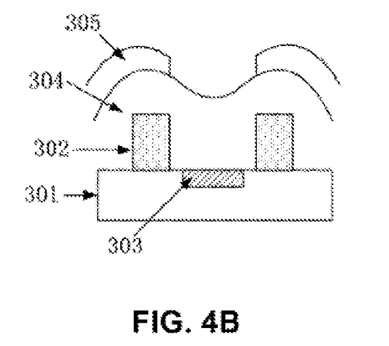
Figure 4C:
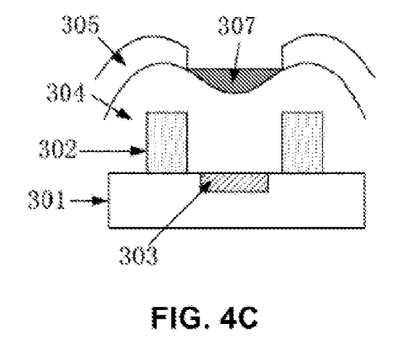
Figure 4D:
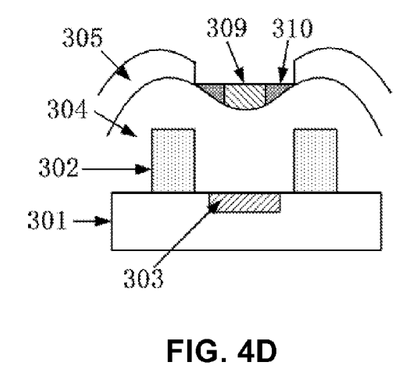
Figure 4E:
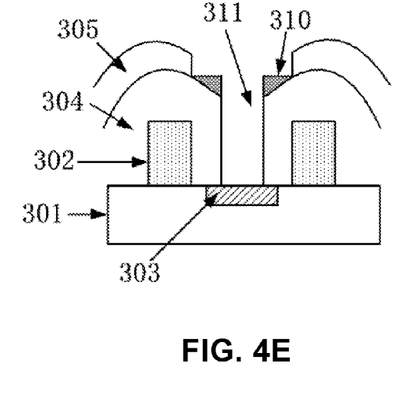
Figure 4F:
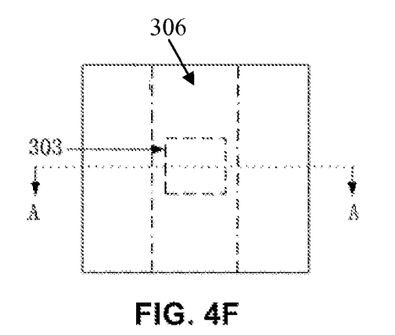

First, referring to FIG. 4A and the corresponding FIG. 4F, at least two adjacent gate lines 302 are formed on a substrate 301, and a doped area 303 is formed in the substrate between the two gate lines 302 (S201). Then, an interlayer dielectric layer 304 is deposited on the substrate 301 (S202). The surface of the substrate is not flat due to the present of the two gate lines 302, therefore the deposited interlayer dielectric layer 304 naturally has a recess 306 between the two gate lines 302. For convenience, in FIG. 4F, the recess 306 is denoted by a dash dotted line (two dashes-one dot) and the doped area 303 in the substrate is denoted by a dashed line.

Figure 4G:
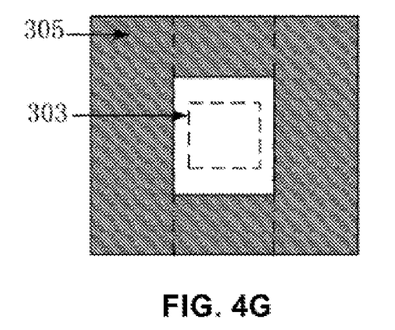

Next, referring to FIG. 4B and the corresponding FIG. 4G, a hard mask layer 305 is deposited on the interlayer dielectric layer 304 (S203). Then, the hard mask layer 305 is etched so as to form an opening in the hard mask layer 305, from which at least a portion of the recess 306 above the doped area 303 is exposed (S204). For example, the hard mask layer 305 may be etched by a dry etching process. The hard mask layer 305 may comprise, for example, silicon nitride, titanium nitride, boron nitride or the like.

In the present example, as shown in FIG. 4G, the opening is a rectangular opening, which does not extend beyond the recess 306 of the interlayer dielectric layer 304 in the direction perpendicular to the length direction of the gate lines 302.

Figure 4H:
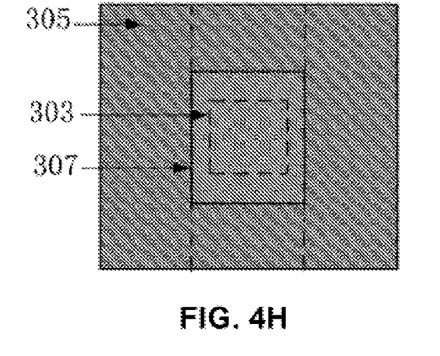

Next, referring to FIG. 4C and the corresponding FIG. 4H, a diblock copolymer 307 composed of a first component and a second component is formed over the exposed portion of the recess 306 above the doped area 303 (S205). For example, the step of forming the diblock copolymer 307 may be performed by a spin coating process. For example, the diblock copolymer 307 may be PS-b-PMMA, in which the first component is PMMA and the second component is PS.

In the present example, the step of forming the diblock copolymer 307 may comprise: forming a film of the diblock copolymer by a spin coating process; and uniformly etching the film of the diblock copolymer such that only the opening is filled with the diblock copolymer, as shown in FIG. 4H.

In the present example, because the interlayer dielectric layer 304 does not have any portion exposed, that is, the interlayer dielectric layer 304 is completely covered by the hard mask layer 305 and the diblock copolymer 307, the coating and patterning operations of the photoresist 308 like those in Example 1 need not to be performed in the present example.

Figure 4I:
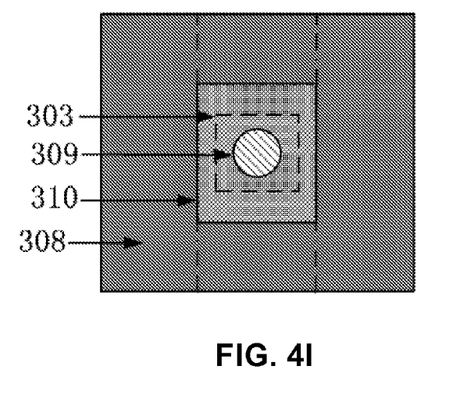

Next, referring to FIG. 4D and the corresponding FIG. 4I, a self-assembly process of the diblock copolymer 307 is performed (S206), so as to form a circular pattern of the first component 309 above the doped area 303, and the first component 309 is surrounded by the second component 310. For example, the self-assembly process may be solvent fumigation or annealing process. Similar to Example 1, in the present example, as shown in FIG. 4I, since the diblock copolymer 307 is confined in an enclosed rectangular frame, the pattern of the first component 309 is a circle located at the centre of the rectangular frame, and the second component 310 surrounds the circular pattern of the first component 309. The diameter of the circular pattern of the first component 309 is controlled by adjusting the mass ratio of the first and second components in the diblock copolymer 307 or the molecular weight of the diblock copolymer 307.

Figure 4J:
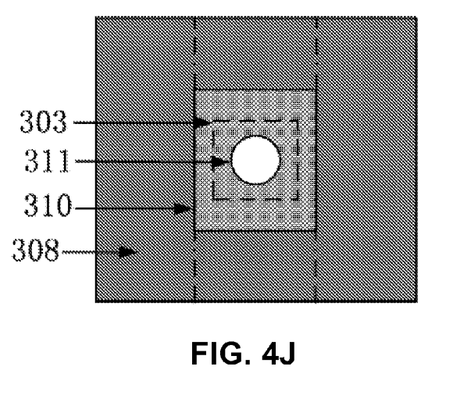

Next, referring to FIG. 4E and the corresponding FIG. 4J, the first component 309 is removed (S207). Then the interlayer dielectric layer 304 is etched by using the second component 310 and the hard mask layer 305 as masks, until the doped area 303 is exposed, thereby forming a contact hole 311 for the doped area (S208).

For example, the first component 309 may be removed by a plasma etching process. The gases used in the plasma etching process may comprise, for example: $O_2$, $Ar/O_2$, $Ar$, $CF_4$ or $CHF_3/O_2$. Alternatively, the first component 309 may be removed by a wet etching process. For example, the first component 309 may be wet etched away by using acetic acid. In the case that PMMA is used as the first component, the PMMA component may be selectively removed with acetic acid under the irradiation of ultraviolet light. For example, the interlayer dielectric layer 304 may be etched by a plasma etching process.

Finally, a contact hole with small size that is precisely aligned with the doped area 303 is formed.

The steps of forming a contact hole for a doped area according to an exemplary embodiment of the present invention has been described in detail in conjunction with FIG. 2, FIGS. 3A~3L and FIGS. 4A~4J. However, the present invention is not limited thereto. For example, those skilled in the art may appreciate that the opening in the hard mask layer can be designed with other shapes without departing from the spirit of the present invention.

Figure 5:
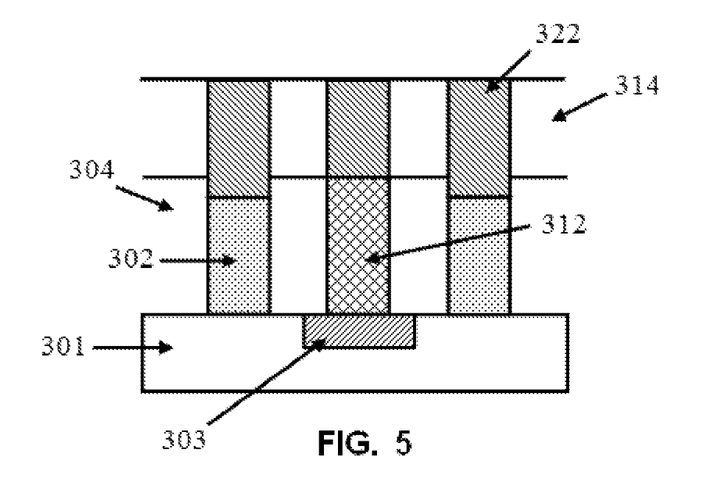
FIG. 5 exemplarily shows a sectional view of semiconductor devices after forming a contact member in contact with the doped area.

Furthermore, in order to form a contact member 312 in contact with the doped area, after forming the contact hole for the doped area as described above (step S208), the contact hole is filled with metal such as Cu. After filling the contact hole, a planarization process such as chemical mechanical polishing is performed so as to planarize the surfaces of the interlayer dielectric layer and the filled metal, as shown in FIG. 5.

Further, in order to form contact holes for contacting gate lines and a contact hole for forming a share contact member, after the surface planarization, another interlayer dielectric layer 314 is deposited and then patterned through photolithography and etching, so as to form the contact holes for contacting the gate lines and the contact hole for forming the share contact member. After forming these contact holes, these contact holes are filled with metal 322 such as Cu. Then, a planarization process such as chemical mechanical polishing is performed again so as to planarize the surfaces of that another interlayer dielectric layer and the filled metal as shown in FIG. 5.

In summary, as described above, according to the present invention, by forming a contact hole for an doped area by means of the self-assembly characteristic of diblock copolymer and a recess of an interlayer dielectric layer naturally formed between two gate lines, it is ensured that the contact hole for the doped area can be precisely aligned with the doped area, thereby improving the yield of semiconductor devices. Furthermore, the process of forming a contact hole by means of diblock copolymer according to the present invention is simple and compatible with standard processes of semiconductor device fabrication, thereby reducing cost for fabricating semiconductor devices.

Thus, the method of fabricating semiconductor devices according to the present invention has been described in detail. In order to avoid obscuring the concept of the present invention, some details well known in the art are not described herein. Those skilled in the art would apparently know how to implement the technical solution disclosed herein based on the above description.

While the present invention has been described in detail with reference to exemplary embodiments, it should be understood by a person skilled in the art that the above exemplary embodiments are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method of fabricating semiconductor devices, comprising:
    forming at least two adjacent gate lines on a substrate, and forming a doped area in the substrate between the two adjacent gate lines;
    depositing a first interlayer dielectric layer overlying the gate lines on the substrate, the first interlayer dielectric layer having a recess between the two adjacent gate lines;
    depositing a hard mask layer on the first interlayer dielectric layer;
    etching the hard mask layer, so as to form an opening in the hard mask layer, from which at least a portion of the recess above the doped area is exposed;
    forming a diblock copolymer over an exposed portion of the recess above the doped area, the diblock polymer being composed of a first component and a second component, wherein only the opening is filled with the diblock polymer;
    performing a self-assembly process on the diblock copolymer, so as to form a circular pattern of the first component above the doped area, the circular pattern of the first component being surrounded by the second component;
    removing the first component; and
    etching the first interlayer dielectric layer by using the second component and the hard mask layer as masks, until the doped area is exposed, so as to form a first contact hole for contacting the doped area,
    wherein the diblock copolymer over the exposed portion of the recess above the doped area before performing a self-assembly process on the diblock copolymer has a substantially rectangular shape.

2. The method according to claim 1, further comprising: after forming the first contact hole, filling the first contact hole with a first metal so as to form a first contact member.

3. The method according to claim 2, wherein the first metal comprises copper.

4. The method according to claim 2, further comprising: after filling the first contact hole, performing a planarization process so as to planarize the surfaces of the first interlayer dielectric layer and the filled first metal.

5. The method according to claim 4, wherein the planarization process is performed by chemical mechanical polishing.

6. The method according to claim 4, further comprising: after performing the planarization process, depositing a second interlayer dielectric layer, and patterning the second interlayer dielectric layer through photolithography and etching, so as to form a plurality of contact holes for contacting the gate lines and a second contact hole for contacting the first contact member.

7. The method according to claim 6, further comprising: after forming the plurality of contact holes for contacting the gate lines and the second contact hole for contacting the first contact member, filling the plurality of contact holes and the second contact hole with a second metal, and performing a planarization process so as to planarize the surfaces of the second interlayer dielectric layer and the filled metal.

8. The method according to claim 7, wherein the second metal in the plurality of contact holes and the second metal in the second contact hole comprise copper.

9. The method according to claim 7, wherein the planarization process is performed by chemical mechanical polishing.

10. The method according to claim 1, wherein the hard mask layer is etched by a dry etching process.

11. The method according to claim 1, wherein the hard mask layer comprises silicon nitride, titanium nitride, or boron nitride.

12. The method according to claim 1, wherein the step of forming the diblock copolymer is performed by a spin coating process.

13. The method according to claim 1, wherein the diblock copolymer is polystyrene-block-poly(methyl methacrylate) copolymer, in which the first component is poly(methyl methacrylate) and the second component is polystyrene.

14. The method according to claim 1, wherein the self-assembly process is a solvent fumigation or an annealing process.

15. The method according to claim 1, wherein the first component is removed by a plasma etching process.

16. The method according to claim 15, wherein the gases used in the plasma etching process comprise: $O_2$, $Ar/O_2$, Ar, $CF_4$ or $CHF_3/O_2$.

17. The method according to claim 1, wherein the first component is removed by a wet etching process.

18. The method according to claim 17, wherein the first component is wet etched away by using acetic acid.

19. The method according to claim 1, wherein the diameter of the circular pattern of the first component is controlled by adjusting the mass ratio of the first and second components in the diblock copolymer or the molecular weight of the diblock copolymer.

20. The method according to claim 1, wherein the first interlayer dielectric layer is etched by a plasma etching process.

21. The method according to claim 1, wherein the opening is a trench-shaped opening, the length direction of which is perpendicular to the length direction of the gate lines.

22. The method according to claim 21, wherein the step of forming the diblock copolymer comprises:
   forming a film of the diblock copolymer by a spin coating process; and
   uniformly etching the film of the diblock copolymer such that only the portion of the recess exposed from the opening is filled with the diblock copolymer.

23. The method according to claim 22, further comprising: before removing the first component, coating a photoresist, and then patterning the photoresist so as to at least cover a portion of the first interlayer dielectric layer that is not covered by the hard mask layer and the diblock copolymer.

24. The method according to claim 1, wherein the opening in the hard mask layer is a rectangular opening, which does not extend beyond the recess of the first interlayer dielectric layer in the direction perpendicular to the length direction of the gate lines.

25. The method according to claim 24, wherein the step of forming the diblock copolymer comprises:
   forming a film of the diblock copolymer by a spin coating process; and
   uniformly etching the film of the diblock copolymer such that only the opening in the hard mask layer is filled with the diblock copolymer.

\* \* \* \* \*